(12) United States Patent
Geukes et al.

(10) Patent No.: US 8,972,808 B2
(45) Date of Patent: *Mar. 3, 2015

(54) CONTROLLING SCAN ACCESS TO A SCAN CHAIN

(71) Applicant: International Business Machines Corporation, Armonk, NY (US)

(72) Inventors: Benedikt Geukes, Boeblingen (DE); Heiko Michel, Stuttgart (DE); Matteo Michel, Boeblingen (DE); Manfred Walz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/850,371

(22) Filed: Mar. 26, 2013

(65) Prior Publication Data

US 2013/0219236 A1 Aug. 22, 2013

Related U.S. Application Data

(63) Continuation of application No. 13/707,555, filed on Dec. 6, 2012.

(30) Foreign Application Priority Data

Dec. 7, 2011 (EP) .................................. 11192483

(51) Int. Cl.
  *G01R 31/28* (2006.01)
  *G01R 31/3177* (2006.01)
  *G01R 31/3185* (2006.01)

(52) U.S. Cl.
  CPC .... *G01R 31/3177* (2013.01); *G01R 31/318555* (2013.01)

USPC ............... 714/726; 714/733; 714/34; 714/31; 714/25

(58) Field of Classification Search
  CPC ............... G01R 31/318536; G01R 31/318541; G01R 31/318572; G01R 31/318555; H05K 999/99
  USPC .................................. 714/726, 733, 34, 31, 25
  See application file for complete search history.

(56) References Cited

U.S. PATENT DOCUMENTS

| 8,438,436 | B1 * | 5/2013 | Baker et al. | 714/726 |
| 2008/0104464 | A1 * | 5/2008 | Elliott | 714/726 |
| 2013/0151915 | A1 * | 6/2013 | Geukes et al. | 714/726 |

OTHER PUBLICATIONS

U.S. Appl. No. 13/707,555 entitled "Efficiency of Compression of Data Pages"; Non-final office action dated Apr. 18, 2014 (20 pp).

*Primary Examiner* — Albert Decady
*Assistant Examiner* — Kyle Vallecillo
(74) *Attorney, Agent, or Firm* — Yudell Isidore PLLC; Steven L Bennett

(57) ABSTRACT

A technique for controlling scan access of multiple scan devices (including or more slave scan devices and a master scan device) to a scan chain includes sending, by a requesting slave scan device included in the one or more slave scan devices, a first request for access to the scan chain to the master scan device. The master scan device and the one or more slave scan devices are connected to the scan chain. The technique also includes receiving, at the requesting slave scan device, an evaluation result from the master scan device and accessing, by the requesting slave scan device, the scan chain in response to the evaluation result indicating access granted. Finally, the technique includes sending, by the requesting slave scan device, one or more second requests for access to the scan chain to the master scan device in response to the evaluation result indicating access denied.

12 Claims, 2 Drawing Sheets

CONTROLLING SCAN ACCESS TO A SCAN CHAIN

This application is a continuation of U.S. patent application Ser. No. 13/707,555, entitled "TECHNIQUES FOR CONTROLLING SCAN ACCESS TO A SCAN CHAIN," filed on Dec. 6, 2012, which claims priority to European Patent Application No. EP11192483, entitled "Method For Controlling Scan Access To A Scan Chain," filed Dec. 7, 2011, the disclosures of which are hereby incorporated herein by reference in their entirety for all purposes.

BACKGROUND

This disclosure relates generally to semiconductor integrated circuits and, more particularly, to techniques for controlling access of multiple scan devices to a scan chain.

Scan chains may be employed in integrated circuits (chips) to facilitate design for test. Scan chains provide a relatively simple way to set and observe latches or flip-flops in the chip. The basic structure of a scan includes providing scan_in and scan_out signals to define the input and output of a scan chain. In a full scan mode each input (scan_in) usually only drives only one scan chain and an output (scan_out) of each scan chain is observed. In a chip that does not have a full scan design, i.e., a chip that has sequential circuits such as memory elements that are not part of the scan chain, sequential pattern generation may be employed. Test pattern generation for sequential circuits searches for a sequence of vectors to detect a particular fault through the space of all possible vector sequences.

Modern integrated circuits design has greatly advanced and layouts of current integrated circuits are often highly complex. In general, integrated circuits may need to be initialized to a defined state. Moreover, functional tests of integrated circuits components, e.g., a scan chain of latches, may be complicated and need to be performed in a reliable manner. In general, conventional approaches have exclusively assigned a scan chain to one scan device.

SUMMARY

According to one aspect of the present disclosure, a technique for controlling scan access of multiple scan devices (including one or more slave scan devices and a master scan device) to a scan chain includes sending, by a requesting slave scan device included in the one or more slave scan devices, a first request for access to the scan chain to the master scan device. The master scan device and the one or more slave scan devices are connected to the scan chain. The technique also includes receiving, at the requesting slave scan device, an evaluation result from the master scan device and accessing, by the requesting slave scan device, the scan chain in response to the evaluation result indicating access granted. Finally, the technique includes sending, by the requesting slave scan device, one or more second requests for access to the scan chain to the master scan device in response to the evaluation result indicating access denied.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
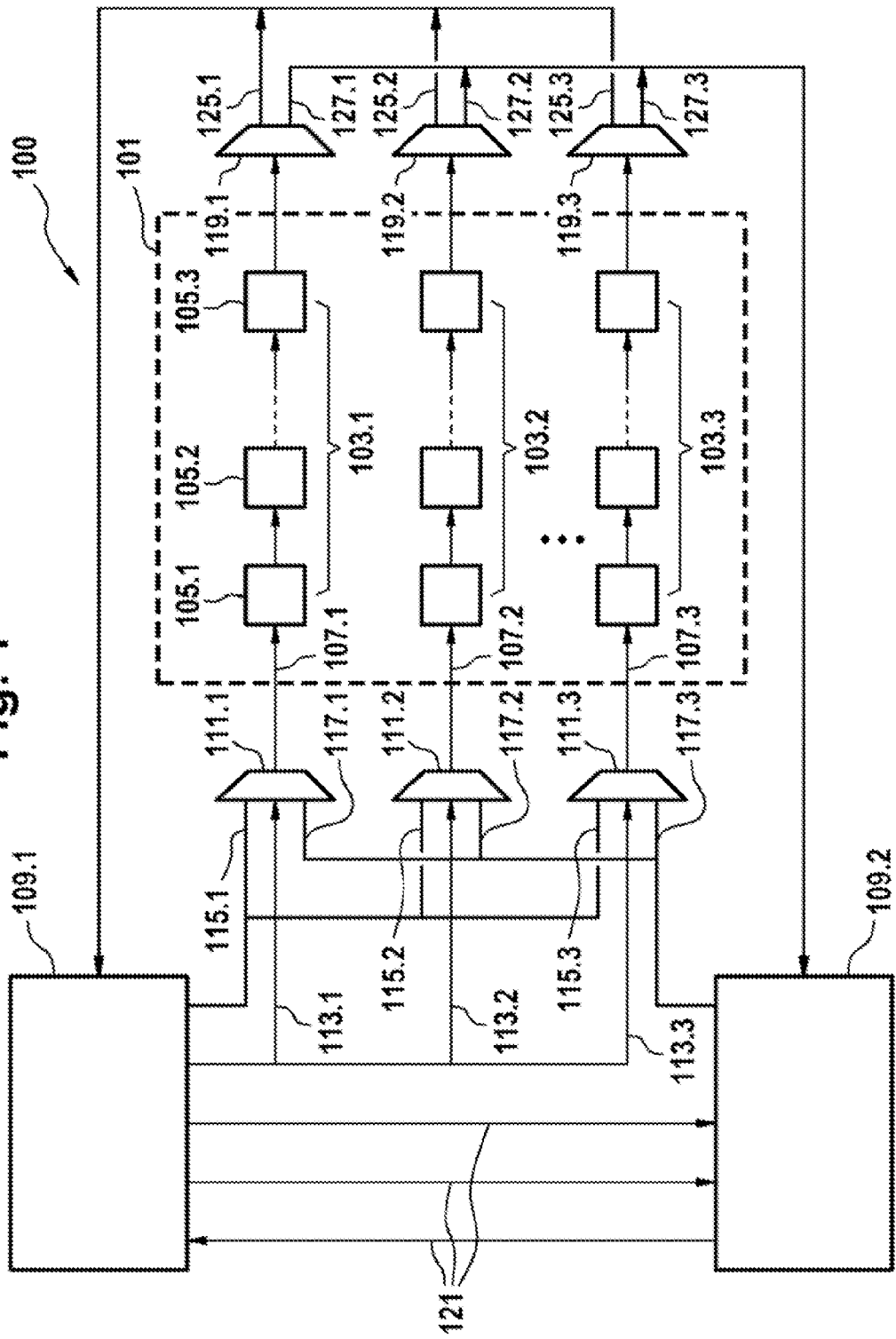
FIG. 1 illustrates a system configured to control scan access to a scan chain, according to various aspects of the present disclosure.

As will be appreciated by one skilled in the art, aspects of the present invention may be embodied as a system, method, or computer program product (e.g., in the form of one or more design files). Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but is not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium include: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet service provider (ISP)).

Aspects of the present invention are described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. As may be used herein, the term "coupled" includes both a direct electrical connection between blocks or components and an indirect electrical connection between blocks or components achieved using one or more intervening blocks or components.

The term "computer memory" or "memory" is an example of a computer-readable storage medium. Computer memory is any memory that is accessible by a processor. Examples of computer memory include: RAM memory, registers, and register files. In some instances a computer memory may also include: a hard disk drive, a floppy drive, or a solid state drive. For example, part of a memory may, in fact, be swap space on a hard disk drive. As used herein, references to "computer memory" or "memory" should be interpreted as possibly including multiple memories. The memory may, for example, include multiple memories within the same computer system. The memory may also comprise multiple memories distributed among multiple computer systems or computing devices. The term "processor" as used herein encompasses an electronic component which is able to execute a program or machine executable instruction. As used herein, references to a computing device comprising a "processor" should be interpreted as possibly including more than one processor or processing core. The processor may, for example, be a multi-core processor. A processor may also refer to a collection of processors within a single computer system or distributed among multiple computer systems.

The term "chip" as used herein refers to an integrated circuit. Circuits and circuitry may comprise general or specific purpose hardware, or may comprise hardware and associated software such as firmware or object code. In particular, a chip may be an application specific integrated circuit (ASIC) or a system on a chip (SOC). Components of a chip include all the circuit elements necessary for implementing a logic circuit, such as sequential logic (e.g., latches). The term "scan chain" is used herein to describe any scan chain configuration having a plurality of scan cells serially coupled together. Scan cells may be multi-purpose memory elements, e.g., latches, which may be used either for a functional testing purpose or for initializing the functionality of a chip. The term "scan device" as used herein refers to a device that allows for shifting bits into a scan chain of a chip in order to perform a functional test within the chip. A scan device may also be used to initialize a functionality of a chip by setting latches to desired values. The term "slave scan device" refers to a scan device that accesses a scan chain in dependence on a received signal from a master scan device. The term "master scan device" is a scan device that manages scan access to a scan chain by one or more slave scan devices. The term "multiplexer" as used herein refers to any structure or digital logic element that is used to select one of several analog or digital input signals and couple the selected input to a single output line.

According to one aspect of the present disclosure, a method for controlling scan access of multiple scan devices (which include one or more slave scan devices and a master scan device) to a scan chain is disclosed. The method includes one or more slave scan devices sending a first request, for scan access to the scan chain, to the master scan device. The master scan device is connected to the scan chain and each of the one or more slave scan devices is also connected to the scan chain. The master scan device receives the first request and evaluates the first request and sends an evaluation result to the requesting slave scan device. The evaluation result indicates whether the requested access is granted or denied. The requesting slave scan device receives the result and accesses the scan chain in response to the result indicating access granted. If the result indicates access denied or prohibited, the requesting slave scan device may send one or more second requests, for scan access to the scan chain, to the master scan device. In contrast to conventional approaches, where a scan chain is exclusively assigned to one scan device, the disclosed techniques advantageously allow multiple scan devices to access a same scan chain. In this case, multiple scan devices are all connected to a same comprehensive space of scan chains.

According to another embodiment, one or more communication lines are implemented to connect a master scan device with each of one or more slave scan devices. In this case, each of the communication lines is either in an active state or an inactive state. In one or more embodiments, the one or more communication lines include a request access communication line. When the request access communication line is in an active state, a sequence of access-request-signals may be transmitted from a slave scan device to a master scan device. A first request is implemented by sending a sequence of access-request-signals from a requesting slave scan device to the master scan device.

The one or more communication lines may also include an access granted communication line. When the access granted communication line is in an active state a sequence of access-granted-signals may be transmitted from a master scan device to a requesting slave scan device. The one or more communication lines may also include a request dropped communication line. When the request dropped communication line is in an active state, a sequence of request-dropped-signals may be transmitted from a master scan device to a requesting slave scan device. In the event that the requested access was not granted, the state of the request dropped communication line (between the master scan device and the requesting slave scan device) may be set to active and sending of an evaluation result may be implemented as a sequence of request-dropped-signals (from the master scan device to the requesting slave scan device). In general, embodiments of the present disclosure may advantageously provide different communication lines between a master scan device and slave scan devices. In this manner, different signals may be transmitted via each communication line, which allows for an optimal communication and avoids bottlenecks that may be associated with using a single communication line.

According to one or more embodiments, a master scan device and one or more slave scan devices may be organized into two or more priority levels ordered from highest to lowest. According to this embodiment, the master scan device has the highest priority level. According to this embodiment, when multiple slave scan devices request access to a scan chain, a master scan device grants access to the slave scan device having the highest priority level, when the master scan device is not scanning the scan chain. The various embodiments may be advantageous in that scan access is managed, by a master scan device, in a transparent manner from point-of-view of a scan chain. This allows for a prioritized and shared access to a same scan chain by multiple scan devices.

According to another embodiment, a master scan device is connected via a scan select communication line with a multiplexer. The scan select communication line may be in an active state or inactive state. When an evaluation result indicates that a requested access was not granted, a master scan device may activate a request dropped communication line for transmitting a sequence of request-dropped-signals (from the master scan device to the requesting slave scan device) and sending by the master scan device an identifier of the master scan device to indicate that the master scan device is currently accessing the scan chain. When the scan select communication line is in an active state, a sequence of signals is transmitted from the master scan device to the multiplexer. This sequence of signals indicates a scan device has been granted access to the scan chain. According to various embodiments, the multiplexer is controlled by the signals received from the master scan device through the scan select communication line so that a scan chain may be accessed separately by one of the scan devices that has been granted access to the scan chain.

According to another embodiment, evaluating a first request further comprises if a scan chain is currently scanned by a master scan device, prohibiting access to the scan chain by a requesting slave scan device and if the scan chain is not currently being scanned, granting the requesting slave scan device access to the scan chain. In general, the various embodiments advantageously prevent concurrent corruptive shifting of data into/out of a scan chain. In this manner, conflicts between scan outputs of concurrent tests may be avoided.

According to another embodiment, when a master scan device desires to access a scan chain and the scan chain is currently being scanned by a slave scan device, the master scan device may deactivate the access granted communication line to stop the scanning of the scan chain by the slave scan device. According to another embodiment, a requesting slave scan device may monitor the request dropped communication line while executing a scan of the scan chain to determine if a sequence of request-dropped-signals is received while executing the scan. The requesting slave scan device may also monitor the access granted communication line while executing a scan of a scan chain for a sequence of access-granted-signals. In response to the requesting slave scan device determining the access granted communication line was deactivated and/or that the request dropped communication line was activated, the requesting slave scan device may stop the scan and activate the request access communication line. In response to the requesting slave scan device determining the access granted communication line is active, the slave scan device may continue the scan.

A system for controlling scan access to a scan chain for testing and detecting a defect in the scan chain and its logic circuitry may include a master scan device, one or more slave scan devices, and one or more scan chains. The master scan device and each of the slave scan devices may be connected via a multiplexer to the scan chain and each of the slave scan devices may be configured for sending a first request to the master scan device. The first request corresponds to a request for accessing a scan chain. The master scan device is configured to receive the first request from a requesting slave scan device and evaluate the first request. The master scan device is further configured to send an evaluation result to the requesting slave scan device. The evaluation result indicates if the requested access is granted or denied. The requesting slave scan device is configured to receive the evaluation result and access the scan chain if the evaluation result indicates access is granted. The requesting slave scan device is also configured to send one or more second requests (requesting access to the scan chain) to the master scan device in response to the evaluation result indicating access to the scan chain is denied.

FIG. 1 shows a block diagram 100 of a structure of a testing apparatus for an integrated circuit 101. The integrated circuit 101 includes multiple scan chains 103. In the following discussion, reference to scan chain 103.1 also applies to other scan chains, such us scan chains 103.2 and 103.3. The scan chain 103.1 includes a plurality of scan cells 105 serially coupled together. The scan cells 105 may be multi-purpose memory elements, e.g., latches. First scan cell 105.1 in scan chain 103.1 has its scan input port coupled to an external input pin, and a last scan cell 105.3 in scan chain 103.1 has its output port coupled to an external output pin. Scan chain 103.1 provides a scan path 107 from input pins, through each intervening scan cell 105, and then ending at the output pin. The input pin provides test input to the scan chain 103.1 for scanning and is connected to scan devices 109. The output pin receives a test output from scan chain 103 after scanning and is connected to the scan devices 109.

Scan devices 109 provide control signals on scan path 107 from one of the input pins. Scan cells 105 are then tested by sequentially shifting control data into first scan cell 105.1 and shifting the data through the series to last scan cell 105.3. Scan device 109 may also initialize a functionality of the integrated circuit by setting scan cells 105 to desired values. As is illustrated in FIG. 1, a multiplexer 111 operates under the control of a scan mode select signal line 113 so that a scan chain 103.1 may be accessed separately by one of scan devices 109. Depending on a state of scan mode select signal 113, multiplexer 111 provides input data through input data line 115 or through input data line 117 respectively to first scan cell 105.1.

A demultiplexer 119 processes scan output data into single scan output lines 125, 127 that return scan output data to scan device 109. Scan devices 109 include a master scan device 109.1 and one or more slave scan devices 109.2. Master scan device 109.1 is connected via a scan select communication line 113 with multiplexer 111. When scan select communication line 113 is in an active state, master scan device 109.1 sends an identifier of master scan device 109.1. The identifier indicates whether master scan device 109.1 is scanning scan chain 103 or not.

Master scan device 109.1 and slave scan device 109.2 communicate through, for example, three communication lines 121 including a request access communication line, an access granted communication line, and a request dropped communication line. Alternatively the functions performed on the request access communication line, the access granted communication line, and the request dropped communication line can also be performed on one or two communication lines. When the request access communication line is in an active state, a sequence of access-request-signals is transmitted from slave scan device 109.2 to master scan device 109.1. The sequence of access-request-signals indicates that slave scan device 109.2 is requesting an access to scan chain 103 from master scan device 109.1.

When the access granted communication line is in an active state, a sequence of access-granted-signals is transmitted from master scan device 109.1 to slave scan device 109.2. The sequence of access-granted-signals indicates that slave scan device 109.2 has been granted access to scan chain 103. When the request dropped communication line is in an active state, a sequence of request-dropped-signals is transmitted from master scan device 109.1 to slave scan device 109.2. The sequence of request-dropped-signals indicates that slave scan device 109.2 has not been granted access to scan chain 103.

Figure 2:
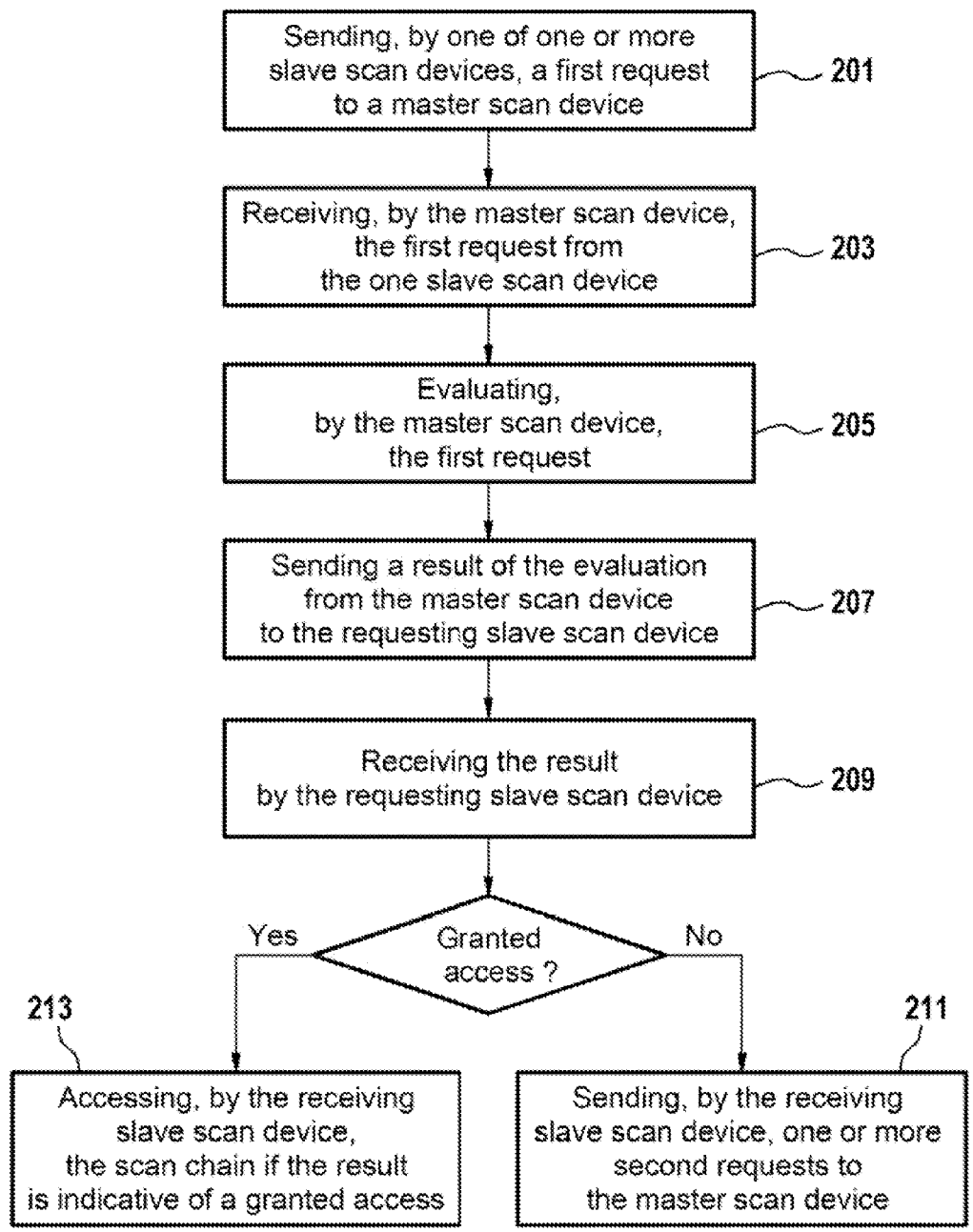
FIG. 2 a flowchart of a method for controlling scan access to a scan chain, according to one aspect of the present disclosure.

FIG. 2 is a flowchart of a method for controlling scan access of multiple scan devices to a scan chain. The multiple scan devices comprise one or more slave scan devices and a master scan device. In block 201, a requesting slave scan device 109.2 (that is included in the one more slave scan devices) sends a first request to master scan device 109.1. Master scan device 109.1 is connected to the scan chain. The first request is a request for a scan access to the scan chain. Each of the one or more slave scan devices is also connected to the scan chain. Upon receiving, in block 203, the first request from requesting slave scan device 109.2, master scan device 109.1 evaluates the first request in block 205.

When master scan device 109.1 is scanning the scan chain that was requested by requesting slave scan device 109.2, master scan device 109.1 prohibits the requested access to the scan chain. In the event that the scan chain is not being scanned, master scan device 109.1 grants access to the scan chain to requesting slave scan device 109.2. In block 207, master scan device 109.1 sends an evaluation result to requesting slave scan device 109.2. The result indicates if the requested access is granted or denied. In block 209, requesting slave scan device 109.2 receives the result from the master scan device 109.1. Finally, in block 213, requesting slave scan device 109.2 accesses the scan chain if the result of the evaluation indicates access is granted. In the event master scan device 109.1 needs access to the scan chain while requesting slave scan device 109.2 is still scanning the scan chain, master scan device 109.1 may stop the scanning of the scan chain by requesting slave scan device 109.2. In the event that the access is denied by master scan device 109.1, requesting slave scan device 109.2, in block 211, sends one or more second requests to master scan device 109.1. Each of the one or more second requests is a request for executing a scan access to the scan chain.

Accordingly, techniques have been disclosed herein that advantageously control access of multiple scan devices to a scan chain.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method for controlling scan access of multiple scan devices to a scan chain, the multiple scan devices including one or more slave scan devices and a master scan device, the method comprising:

a requesting slave scan device included in the one or more slave scan devices sending a first request for access to the scan chain to the master scan device, wherein the master scan device and the one or more slave scan devices are connected to the scan chain;

receiving, at the requesting slave scan device, an evaluation result from the master scan device;

accessing the scan chain in response to the evaluation result indicating access granted; and sending, by the requesting slave scan device, one or more second requests for access to the scan chain to the master scan device in response to the evaluation result indicating access denied.

2. The method of claim 1, further comprising:
receiving, at the master scan device, the first request;
evaluating, by the master scan device, the first request; and
sending the evaluation result from the master scan device to the requesting slave scan device, wherein the evaluation result indicates if the first request is granted or denied.

3. The method of claim 2, further comprising providing one or more communication lines between the master scan device and the one or more slave scan devices, wherein the one or more communication lines include:
  a request access communication line, wherein in response to the request access communication line being in an active state, a sequence of access-request-signals is transmitted from the requesting slave scan device to the master scan device;
  an access granted communication line, wherein in response to the access granted communication line being in an active state, a sequence of access-granted-signals is transmitted from the master scan device to the requesting slave scan device; and
  a request dropped communication line, wherein in response to the request dropped communication line being in an active state, a sequence of request-dropped-signals is transmitted from the master scan device to the requesting slave scan device.

4. The method according to claim 3, wherein the master scan device is connected via a scan select communication line with a multiplexer, the scan select communication line being in one of an active state and an inactive state, and wherein in response to the evaluation result indicating that the requested access was not granted:
  activating, by the master scan device, the request dropped communication line for transmitting the sequence of request-dropped-signals from the master scan device to the requesting slave scan device; and
  sending, by the master scan device, an identifier of the master scan device to indicate that the master scan device is currently accessing the scan chain.

5. The method of claim 2, further comprising:
sending, by the master scan device, an indication of one scan device having been granted access by the master scan device, wherein the one scan device is either the master scan device or the requesting slave scan device.

6. The method of claim 2, wherein the evaluating further comprises:
  in response to the scan chain being currently scanned by the master scan device, denying the requesting slave scan device access to the scan chain; and
  in response to the scan chain not currently being scanned, granting the requesting slave scan device access to the scan chain.

7. The method of claim 3, wherein in response to the master scan device desiring access to the scan chain and the scan chain being currently scanned by the requesting slave scan device:
  deactivating, by the master scan device, the access granted communication line to stop the requesting slave scan device from scanning the scan chain.

8. The method of claim 3, further comprising:
  monitoring, by the requesting slave scan device while executing a scan of the scan chain, the request dropped communication line to determine if the sequence of request-dropped-signals is received while executing the scan;
  monitoring, by the requesting slave scan device while executing the scan of the scan chain, the access granted communication line to determine if the sequence of access-granted-signals is still received while executing the scan;
  in response to the requesting slave scan device determining the access granted communication line is inactive and that the request dropped communication line is active during the scan, stopping the scan and activating the request access communication line; and
  in response to the requesting slave scan device determining the access granted communication line is active during the scan, continuing the scan.

9. A method for controlling scan access of multiple scan devices to a scan chain, the multiple scan devices comprising one or more slave scan devices and a master scan device, the method comprising:
  receiving, at the master scan device, a first request for access to the scan chain from a requesting slave scan device included in the one or more slave scan devices;
  evaluating, by the master scan device, the first request; and
  sending an evaluation result from the master scan device to the requesting slave scan device, wherein the evaluation result indicates if the first request is granted or denied.

10. The method of claim 9, further comprising providing one or more communication lines between the master scan device and the one or more slave scan devices, wherein the one or more communication lines include:
  a request access communication line, wherein in response to the request access communication line being in an active state, a sequence of access-request-signals is transmitted from the requesting slave scan device to the master scan device;
  an access granted communication line, wherein in response to the access granted communication line being in an active state, a sequence of access-granted-signals is transmitted from the master scan device to the requesting slave scan device; and
  a request dropped communication line, wherein in response to the request dropped communication line being in an active state, a sequence of request-dropped-signals is transmitted from the master scan device to the requesting slave scan device.

11. The method of claim 10, wherein the master scan device is connected via a scan select communication line with a multiplexer, the scan select communication line being in one of an active state and an inactive state, and wherein when the evaluation result indicates that the requested access was not granted, the method further comprises:
  activating, by the master scan device, the request dropped communication line for transmitting the sequence of request-dropped-signals from the master scan device to the requesting slave scan device; and
  sending, by the master scan device, an identifier of the master scan device to indicate that the master scan device is currently accessing the scan chain.

12. The method of claim 10, further comprising:
sending, by the master scan device, an indication of one scan device having been granted access by the master scan device, wherein the one scan device is either the master scan device or the requesting slave scan device.

* * * * *